United States Patent
Fan et al.

(10) Patent No.: US 9,470,715 B2
(45) Date of Patent: Oct. 18, 2016

(54) PROBE HEAD

(71) Applicant: MPI Corporation, Hsinchu County (TW)

(72) Inventors: Horng-Kuang Fan, Hsinchu County (TW); Hsien-Ta Hsu, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 436 days.

(21) Appl. No.: 14/150,745

(22) Filed: Jan. 8, 2014

(65) Prior Publication Data

US 2014/0197859 A1     Jul. 17, 2014

(30) Foreign Application Priority Data

Jan. 11, 2013  (TW) .............................. 102101176 A
Dec. 20, 2013  (TW) .............................. 102224151 U (51) Int. Cl.
  *G01R 1/067*  (2006.01)
  *G01R 31/00*  (2006.01)
  *G01R 1/073*  (2006.01)

(52) U.S. Cl.
  CPC ....... *G01R 1/06761* (2013.01); *G01R 1/07314* (2013.01); *G01R 1/07357* (2013.01); *G01R 1/06722* (2013.01)

(58) Field of Classification Search
  CPC .. G01R 1/067; G01R 31/00; G01R 1/06761; G01R 1/07314; G01R 1/07357; G01R 1/06722; H01R 11/08; H01R 13/00; H01R 13/24

USPC ............ 324/755.11, 756.04, 756.03, 756.01, 324/755.01, 755.05, 755.09; 439/482, 824
See application file for complete search history.

(56) References Cited

U.S. PATENT DOCUMENTS

| | | | | |
|---|---|---|---|---|
| 4,548,451 A * | 10/1985 | Benarr | ................... | H05K 3/326 29/848 |
| 4,774,462 A * | 9/1988 | Black | ....................... | G01R 1/04 324/754.03 |
| 5,175,493 A * | 12/1992 | Langgard | ............... | G01R 1/067 324/72.5 |
| 5,200,695 A * | 4/1993 | Kazama | ................. | G01R 1/067 324/72.5 |

(Continued)

FOREIGN PATENT DOCUMENTS

CN     101361184 B     4/2011
CN     102378478 A     3/2012

(Continued)

*Primary Examiner* — Jermele M Hollington
*Assistant Examiner* — Sean Curtis
(74) *Attorney, Agent, or Firm* — CKC & Partners Co., Ltd.

(57) ABSTRACT

A probe head includes a plate, a probe, and at least one composite coating layer. The plate has at least one through hole therein. The probe is at least partially disposed in the through hole of the plate. The composite coating layer includes a metal layer and a plurality of lubricating particles. The metal layer is disposed in the through hole of the plate and between the plate and the probe. The lubricating particles are dispersed in the metal layer.

20 Claims, 7 Drawing Sheets

(56) References Cited

U.S. PATENT DOCUMENTS

| | | | | |
|---|---|---|---|---|
| 5,235,740 A * | 8/1993 | Kroeker | ............ | H05K 13/0482 29/741 |
| 5,575,076 A * | 11/1996 | Creeden | ............ | G01R 1/07328 324/750.19 |
| 5,744,379 A * | 4/1998 | Mandai | ............ | H01L 23/5381 257/E21.705 |
| 6,066,957 A * | 5/2000 | Van Loan | ......... | G01R 1/07328 324/750.19 |
| 6,208,158 B1 * | 3/2001 | Schein | ............ | G01R 1/07328 324/755.05 |
| 6,245,722 B1 * | 6/2001 | Maples | ............... | C10M 107/50 508/208 |
| 6,251,707 B1 | 6/2001 | Bernier et al. | | |
| 6,515,496 B2 * | 2/2003 | Felici | ............... | G01R 1/07357 324/750.25 |
| 6,861,855 B2 * | 3/2005 | Jurine | ............... | G01R 1/0675 324/72.5 |
| 6,917,525 B2 * | 7/2005 | Mok | ................. | G01R 1/06716 361/767 |
| 6,977,515 B2 * | 12/2005 | McQuade | ......... | G01R 1/06744 29/846 |
| 7,173,439 B1 * | 2/2007 | Campbell | ......... | G01R 1/06705 324/750.25 |
| 7,349,223 B2 * | 3/2008 | Haemer | ............ | G01R 1/07314 29/593 |
| 7,368,927 B2 * | 5/2008 | Smith | ............... | G01R 1/07371 324/754.07 |
| 7,417,447 B2 * | 8/2008 | Kister | ............... | G01R 1/07371 324/750.16 |
| 7,951,756 B2 * | 5/2011 | Konishi | ............ | C10M 169/04 428/408 |
| 8,039,096 B2 * | 10/2011 | Zhu | ................... | C23C 14/0605 204/192.11 |
| 8,847,618 B1 * | 9/2014 | Michalko | ......... | G01R 31/2808 324/750.19 |
| 2001/0044225 A1 * | 11/2001 | Eldridge | ......... | G01R 1/06716 439/66 |
| 2002/0053734 A1 * | 5/2002 | Eldridge | ......... | B23K 20/004 257/724 |
| 2003/0099097 A1 * | 5/2003 | Mok | ................. | G01R 1/06716 361/767 |
| 2004/0101666 A1 * | 5/2004 | Tsubosaki | ............ | B32B 15/08 428/209 |
| 2004/0223309 A1 * | 11/2004 | Haemer | ............ | G01R 1/07314 361/767 |
| 2008/0090096 A1 * | 4/2008 | Suzuki | ............... | C23C 2/28 428/674 |
| 2008/0143379 A1 * | 6/2008 | Norman | ............... | H01L 23/50 326/39 |
| 2008/0308307 A1 * | 12/2008 | Chang | ............... | H05K 3/108 174/257 |
| 2010/0102841 A1 * | 4/2010 | Kawada | ............ | G01R 1/06733 324/754.01 |
| 2010/0120301 A1 * | 5/2010 | Sanders | ............ | G01R 1/06722 439/824 |
| 2010/0244867 A1 * | 9/2010 | Chong | ................. | G01R 3/00 324/755.05 |
| 2011/0148448 A1 * | 6/2011 | St. Onge | ............ | G01R 1/07328 324/755.01 |
| 2011/0204911 A1 * | 8/2011 | Kimoto | ............ | G01R 1/06727 324/754.03 |
| 2012/0013360 A1 * | 1/2012 | Oh | ..................... | G01R 3/00 324/763.01 |
| 2012/0098562 A1 * | 4/2012 | Tan | ..................... | G01R 1/06788 324/755.01 |
| 2012/0142210 A1 * | 6/2012 | Di Stefano | ............ | H01R 13/24 439/374 |
| 2014/0197859 A1 * | 7/2014 | Fan | ..................... | G01R 1/07357 324/755.01 |
| 2014/0197860 A1 * | 7/2014 | Hsu | ..................... | G01R 1/07357 324/756.07 |

FOREIGN PATENT DOCUMENTS

| | | | | |
|---|---|---|---|---|
| CN | 203732577 U | * | 7/2014 | |
| GB | 2056187 A | * | 3/1981 | ............ G01R 1/067 |
| JP | 54137056 A | * | 10/1979 | |
| TW | 407453 B | | 10/2000 | |
| TW | 201017855 A | | 5/2010 | |
| TW | 201036213 A | | 10/2010 | |

* cited by examiner

PROBE HEAD

RELATED APPLICATIONS

This application claims priority to Taiwan Application Serial Number 102101176, filed Jan. 11, 2013, and Taiwan Application Serial Number 102224151, filed Dec. 20, 2013, which are herein incorporated by reference.

BACKGROUND

1. Field of Invention

The present invention relates to a probe head. More particularly, the present invention relates to a probe head applied to a probe card.

2. Description of Related Art

A probe head for testing electronic devices generally includes a plurality of plates, each of which has a plurality of through holes. Each of the through holes is configured for accommodating a probe to confine lateral movement of the probe during the testing process of the electronic devices.

However, since the material of the plate is usually different from that of the probe, the hardness difference therebetween may cause problems in use of the probe head. In particular, since the probe may slide along the through hole, both of the probe and the plate rub against each other and worn from the hardness difference therebetween after a long-term use. Moreover, the probe may be stuck in the through hole due to the high coefficient of friction of the wall of the through hole. These are urgent problems to be solved.

SUMMARY

An aspect of the present invention provides a probe head including a plate, a probe, and at least one composite coating layer. The plate has at least one through hole therein. The probe is at least partially disposed in the through hole of the plate. The composite coating layer includes a metal layer and a plurality of lubricating particles. The metal layer is disposed in the through hole of the plate and between the plate and the probe. The lubricating particles are dispersed in the metal layer.

In one or more embodiments, the lubricating particles are made of Polytetrafluoroethene (PTFE).

In one or more embodiments, the metal layer has an outer surface facing the probe and an inner surface opposite the outer surface, and the lubricating particles at the outer surface of the metal layer are denser than the lubricating particles at the inner surface of the metal layer.

In one or more embodiments, the probe head further includes at least one base layer disposed between the metal layer and the plate.

In one or more embodiments, the base layer and the metal layer are made of the same material.

In one or more embodiments, an interface is formed between the base layer and the metal layer.

In one or more embodiments, the probe head further includes a plurality of seeds disposed between the base layer and the plate.

In one or more embodiments, the through hole is circle-shaped or square-shaped.

In one or more embodiments, the plate is made of ceramic.

In one or more embodiments, the plate is made of silicon.

In one or more embodiments, the probe head further includes an insulating layer disposed between the metal layer and the plate.

In one or more embodiments, the probe head further includes an insulating layer covering the entire surface of the plate.

In one or more embodiments, the plate has opposite major surfaces, and the through hole is through the major surfaces. The probe head further includes at least one bypass wire disposed on at least one of the major surfaces of the plate and electrically connected to the composite coating layer.

In one or more embodiments, the bypass wire is electrically connected to at least two of the composite coating layers.

In one or more embodiments, the bypass wire includes at least one major portion electrically connected to at least two of the composite coating layers in series.

In one or more embodiments, the bypass wire further includes at least one minor portion electrically connected to the major portion in parallel.

In one or more embodiments, the minor portion is longer than the major portion.

In one or more embodiments, the probe head further includes a supporting board disposed opposite the plate. The supporting board has at least one via hole therein. At least another portion of the probe is disposed in the via hole of the supporting board. The probe has a contact end for being in electrical contact with a device to be tested, and the contact end is closer to the plate than to the supporting board.

In one or more embodiments, the bypass wire is disposed at least on the major surface of the plate distal to the supporting board.

In one or more embodiments, the bypass wire is disposed at least on the major surface of the plate proximal to the supporting board.

In one or more embodiments, the probe is a vertical buckling probe or a pogo pin.

Therefore, the embodiments of the present invention provide the probe head whose plate includes the composite coating layer. The probe can smoothly slide in the through hole, and the wearing between the probe and the plate can be improved when the probe touches the plate.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1A:
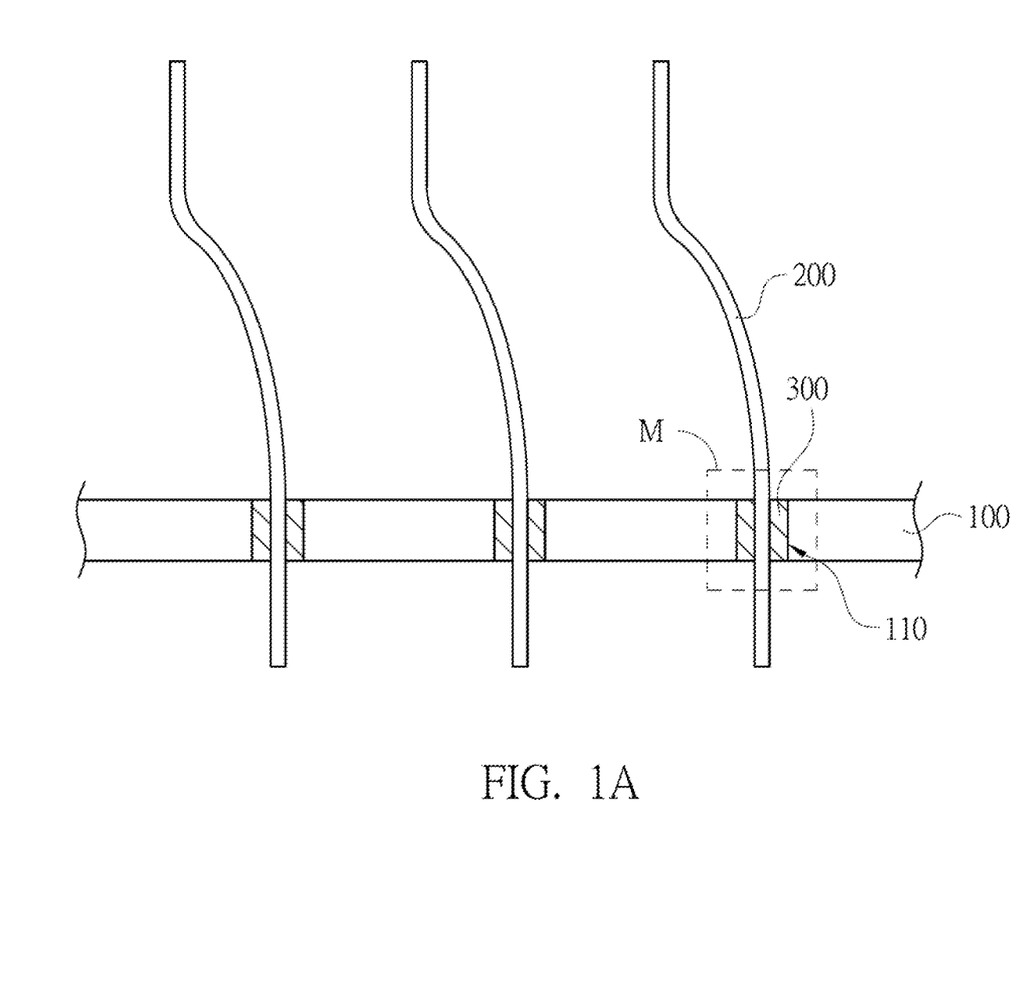
FIG. 1A is a cross-sectional view of a probe head according to one embodiment of the present invention.
Figure 1B:
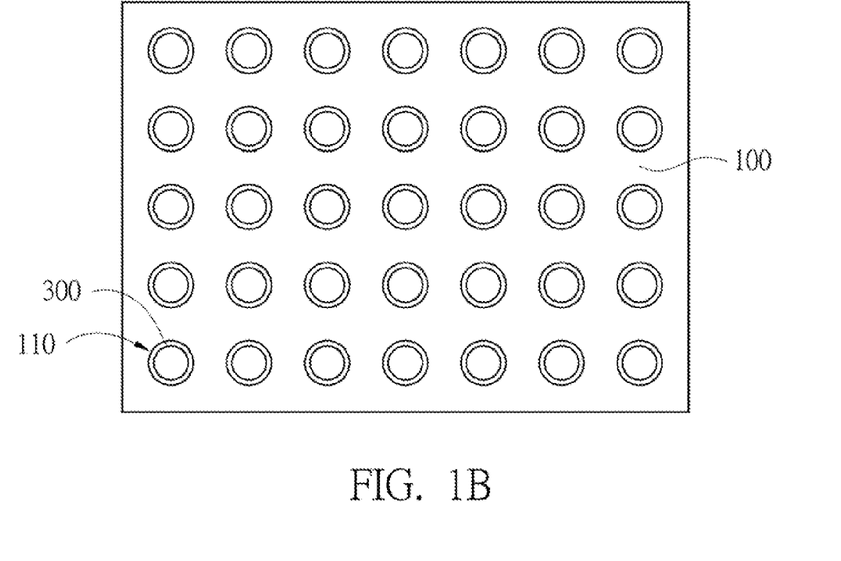
FIG. 1B is a top view of a plate and a composite coating layer of FIG. 1.

FIG. 1A is a cross-sectional view of a probe head according to one embodiment of the present invention, and FIG. 1B is a top view of a plate 100 and a composite coating layer 300 of FIG. 1. Reference is made to FIGS. 1A and 1B. As shown in FIGS. 1A and 1B, the probe head includes the plate 100, a probe 200, and at least one composite coating layer 300. The plate 100 has at least one through hole 110 therein. The probe 200 is at least partially disposed in the through hole 110 of the plate 100. In this embodiment, the probe 200 can be a vertical buckling probe. However, the claimed scope of the present invention is not limited in this respect.

Figure 2:
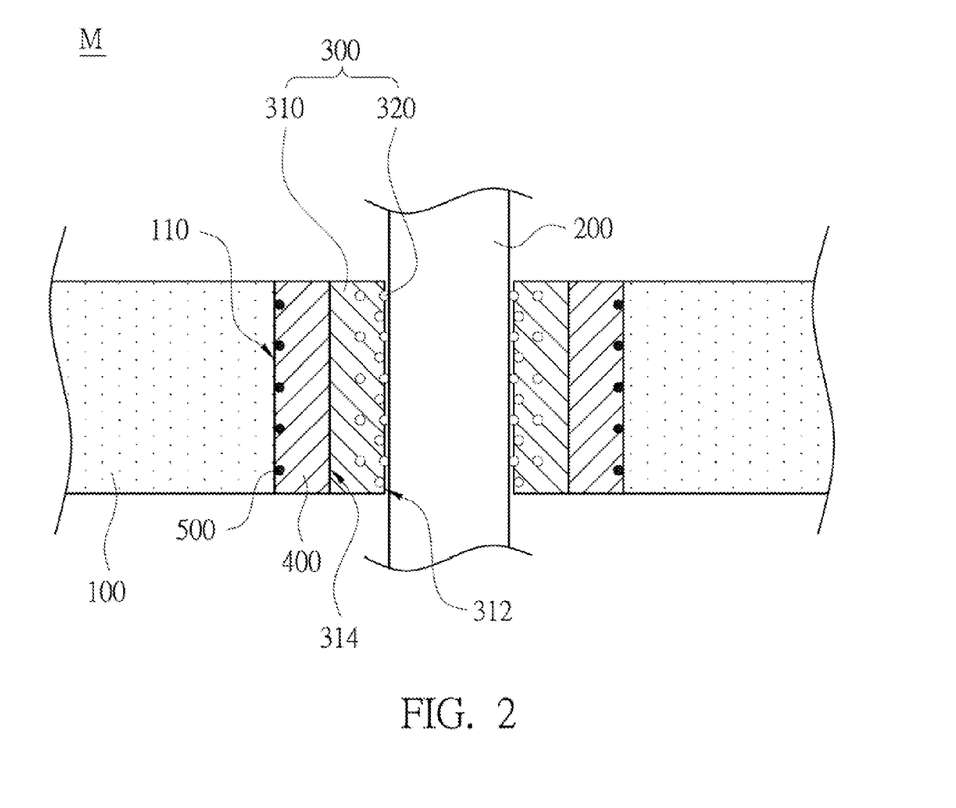
FIG. 2 is an enlarged diagram of area M of FIG. 1A.

Reference is made to FIG. 2 which is an enlarged diagram of area M of FIG. 1A. The composite coating layer 300 includes a metal layer 310 and a plurality of lubricating particles 320, which may be made of metal-polymer. However, the claimed scope of the present invention is not limited in this respect. The metal layer 310 is disposed in the through hole 110 of the plate 100 and between the plate 100 and the probe 200. The lubricating particles 320 are distributed in the metal layer 310.

As such, the probe 200 can insert to the plate 100 from the through hole 110. A portion of the lubricating particles 320 of the composite coating layer 300 may project from the metal layer 310 and touch the probe 200. The probe 200 can slide smoothly in the through hole 110 since the lubricating particles 320 has small coefficient of friction, such that the lubricating particles 320 can prevent the probe 200 from being stuck in the through hole 110. Moreover, the bumped lubricating particles 320 can reduce the contact area between the probe 200 and the plate 100, such that the frictions between the probe 200 and the plate 100 can be educed. Even thought the probe 200 touches the metal layer 310 of the composite coating layer 300, the wearing between the probe 200 and the plate 100 can be improved since the rigidity of the metal 310 is similar to that of the probe 200. Hence, the damages of both of the plate 100 and the probe 200 can be avoided due to the composite coating layer 300. In addition, the composite coating layer 300 can protect the through hole 110 so as to reduce the probability of edge chipping of the through hole 110.

The plate 100 can be made of non-conductive materials, semiconductor materials, or conductive materials with high strength and easy to fabricate. However, the claimed scope of the present invention is not limited in this respect. In this embodiment, the plate 100 may be made of ceramics. Moreover, the lubricating particles 320 of the composite coating layer 300 may be made of polymer particles such as polytetrafluoroethylene (PTFE) for lubricating. The metal layer 310 of the composite coating layer 300 may be made of Au, Co, Ni, Ni alloy, or any combination thereof. The physical properties of the metal layer 310 may be adjusted according to the rigidity of the probe 200. It should be noted that the materials of the lubricating particles 320 and the metal layer 310 are illustrative only and should not limit the claimed scope of the present invention. A person having ordinary skill in the art may select proper materials for the lubricating particles 320 and the metal layer 310 according to actual requirements.

Reference is made to FIG. 2. In one or more embodiments, the metal layer 310 of the composite coating layer 300 and the plate 100 may lack of adhesion if high physical property difference exists between the metal layer 310 and the plate 100, such that the composite coating layer 300 may peel from the through hole 110 easily. Hence, the probe head may further include at least one base layer 400 disposed between the metal layer 310 and the plate 100. Both of the adhesion between the base layer 400 and the plate 100, and the adhesion between the base layer 400 and the metal layer 310 of the composite coating layer 300 are higher than the adhesion between the plate 100 and the metal layer 310, such that the base layer 400 can be a buffer between the plate 100 and the composite coating layer 300 for adhering the composite coating layer 300 on the plate 100.

In this embodiment, the materials of the base layer 400 and the metal layer 310 may be the same. However, an interface, e.g., an inner surface 314 in this embodiment, is between the base layer 400 and the metal layer 310. The interface is formed due to the sequential formations of the base layer 400 and the metal layer 310. However, in other embodiments, the material of the base layer 400 may be different from the material of the metal layer 310. The base layer 400 may be made of Au, Go, Ni, Ni alloy, or any combination thereof.

Reference is made to FIG. 2. In one or more embodiment, the probe head may further include a plurality of seeds 500 if the base layer 400 and the composite coating layer 300 are formed on the plate 100 using chemical vapor deposition process. The seeds 500 are disposed between the base layer 400 and the plate 100 for enhancing the surface active at the wall of the through hole 110, and for providing the formation of the metal layer 310 of the composite coating layer 300. However, the claimed scope of the invention should not be limited in this respect. In other embodiments, the base layer 400 or the metal layer 310 of the composite coating layer 300 can be directly chemical coated on the plate 100 without the seeds 500 if the wall of the through hole 110 is rough enough. The base layer 400 and the composite coating layer 300 can be coated on the wall of the through hole 110 in sequence using chemical vapor deposition technique. In other words, both of the base layer 400 and the metal layer 310 of the composite coating layer 300 are metal coating layers formed using chemical vapor deposition technique. The chemical vapor deposition technique provides uniform forming layers of the base layer 400 and the composite coating layer 300 on the wall of the through hole 110.

Moreover, the lubricating particles 320 can be added into the coating solution which is used to form the metal layer 310, such that the coating solution can be deposited on the base layer 400 to form a portion of the metal layer 310 when coating the composite coating layer 300 using the chemical vapor deposition technique. The lubricating particles 320 in the coating solution may be adhered on this portion of the metal layer 310 if the lubricating particles 320 touch this portion of the metal layer 310. Therefore, the quantity of the lubricating particles 320 in the metal layer 310 gets greater when the metal layer 310 is deposited inwards in the through hole 110. Structurally, the metal layer 310 has an outer surface 312 facing the probe 200 and an inner surface 314 opposite to the outer surface 312. The lubricating particles 320 at the outer surface 312 of the metal layer 310 are denser than the lubricating particles 320 at the inner surface 314 of the metal layer 310. Since the lubricating particles 320 at the outer surface 312 may touch the probe 200, the lubricating effect can be improved if the lubricating particles 320 at the outer surface 312 are denser.

Figure 3:
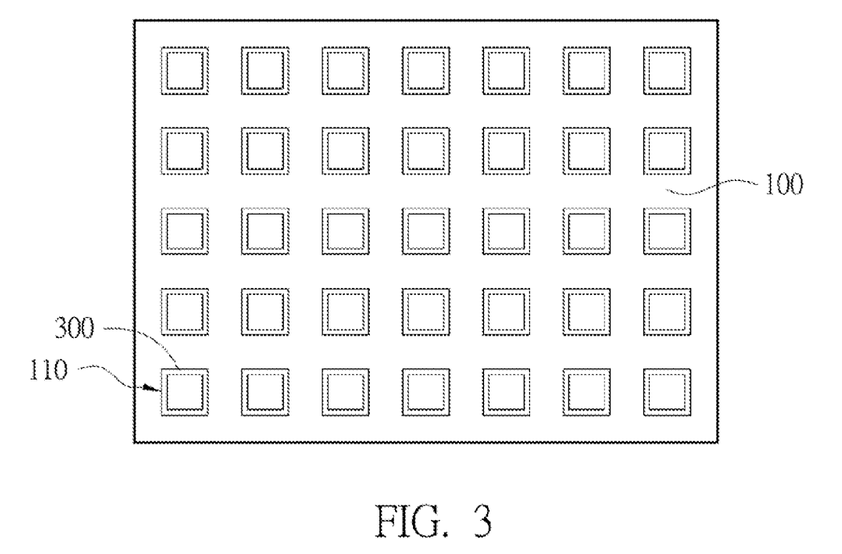
FIG. 3 is a top view of the plate and the composite coating layer according to another embodiment of the present invention.

Reference is made to FIG. 3 which is a top view of the plate 100 and the composite coating layer 300 according to another embodiment of the present invention. The difference between the present embodiment and the embodiment of FIG. 1B relates to the shape of the through holes 110. Although the through holes 110 in FIG. 1B are circle-shaped, the through holes 110 in this embodiment can be square-shaped to accommodate square probes formed using micro electro mechanical systems (MEMS) technique.

Figure 4:
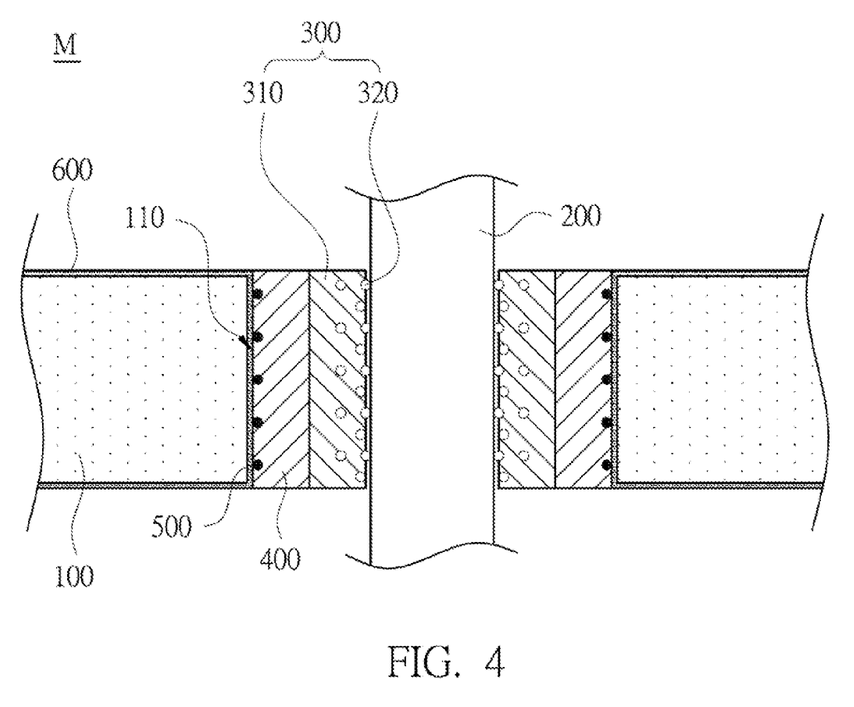
FIG. 4 is an enlarged diagram of area M of FIG. 1A according to another embodiment of the present invention.

Reference is made to FIG. 4 which is an enlarged diagram of area M of FIG. 1A according to another embodiment of the present invention. The difference between the present embodiment and the embodiment of FIG. 2 relates to additional element of an insulating layer 600. As mentioned above, the plate 100 may be made of non-conductors (such as ceramic), semiconductors, or conductors. In some embodiments that the plate 100 is made of semiconductors or conductors, the surfaces of the plate 100 may be insulated to prevent the probes 200 that inserted to the plate 100 from electrically interrupt from each other. The insulating layer 600 may be at least disposed between the metal layer 310 and the plate 100. In this embodiment, the insulating layer 600 can cover the entire surface of the plate 100.

In greater detail, through holes of a general plate are generally formed by drilling. However, the size of the through holes should be reduced as the sizes of the probes are reduced. The through holes with small sizes can not formed in the plate by drilling but other alternative methods. One of the alternative methods provides a Si substrate as the plate 100. The through holes 110 can be formed along the crystal orientation of the Si substrate with dry etching after the Si substrate is patterned. Due to the conductivity of the Si substrate, an insulating process may be manufactured on the surfaces of the dry etched Si substrate to insulate the plate 100. More specifically, the dry etched Si substrate can be disposed in the high temperature furnace to be oxidized, such that an oxidized insulating layer 600, such as $SiO_2$, is formed on the entire surface of the Si substrate. Alternatively, an insulating material can be coated on the dry etched Si substrate, and the claimed scope of the present invention is not limited in this respect. Therefore, a manufacture of forming the composite coating layer 300 can be performed in the Si substrate with the insulating layer 600. Although the plate 100 mentioned above is the Si substrate in this embodiment, the claimed scope of the present invention is not limited in this respect. In other embodiments, the plate 100 may be other semiconductors or conductors, such as GaN, GaAs, or InP.

Figure 5:
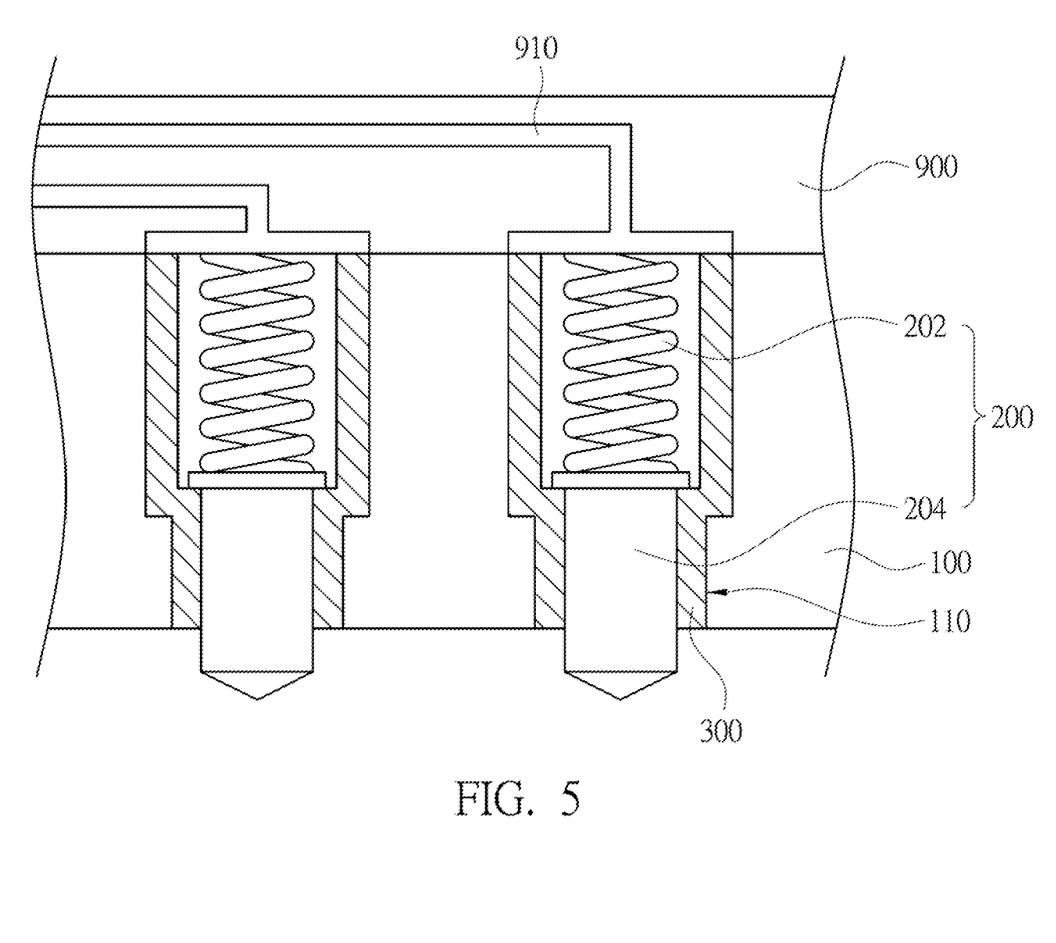
FIG. 5 is a cross-sectional view of the probe head according to yet another embodiment of the present invention.

Reference is made to FIG. 5 which is a cross-sectional view of the probe head according to yet another embodiment of the present invention. The difference of the present embodiment and the embodiment of FIGS. 1A and 1B relates the type of the probe. In this embodiment, the probe 200 is a pogo pin having a spring end 202 and a contacting end 204 opposite to each other. The contacting end 204 can be electrically connected to a device to be tested, and the spring end 202 can be connected to testing circuits 910 to transmit the signals of the pogo pin. The probe head can be disposed on a circuit board 900. More specifically, the plate 100 of the probe head is disposed on the circuit board 900, and the testing circuits 910 can be embedded in the circuit board 900. The signal can be transmitted from the contacting end 204 of the probe 200 to the composite coating layer 300 when the probe 200 touches a testing point of the device, and the composite coating layer 300 can further transmit the signal to the testing circuits 910. In this embodiment, since the signal is transmitted through the composite coating layer 300 of the pogo pin rather than through the spring end 202, the signal loss, especially the high frequency signal loss, of the pogo pin can be improved. Other features of the probe head are the same as those of the probe head shown in FIG. 1A, and therefore, a description in this regard will not be provided hereinafter. In general, a spatial converter board can be added between the circuit board 900 and the probe head. Some testing circuits are embedded in the spatial converter board, and each of the testing circuits has contact terminals respectively disposed at two ends of the testing circuit. In other words, a plurality of the contact terminals corresponding to each other are respectively disposed on two surfaces of the spatial converter board respectively facing the probe 200 and facing the circuit plate 900, such that the two surfaces of the spatial converter board can be respectively electrically connected to the testing circuits 910 of the circuit board 900 and the probe 200. A pitch of two adjacent contact terminals on the surface of the spatial converter board facing the probe 200 is less than that of the two adjacent contact terminals on the surface of the spatial converter board facing the circuit board 900.

Moreover, Reference is made to FIGS. 1A and 5. The composite coating layer 300 of the embodiments of the present invention can partially disposed in the through holes 110 or completely disposed in the through holes 110 according to real requirements.

Figure 6:
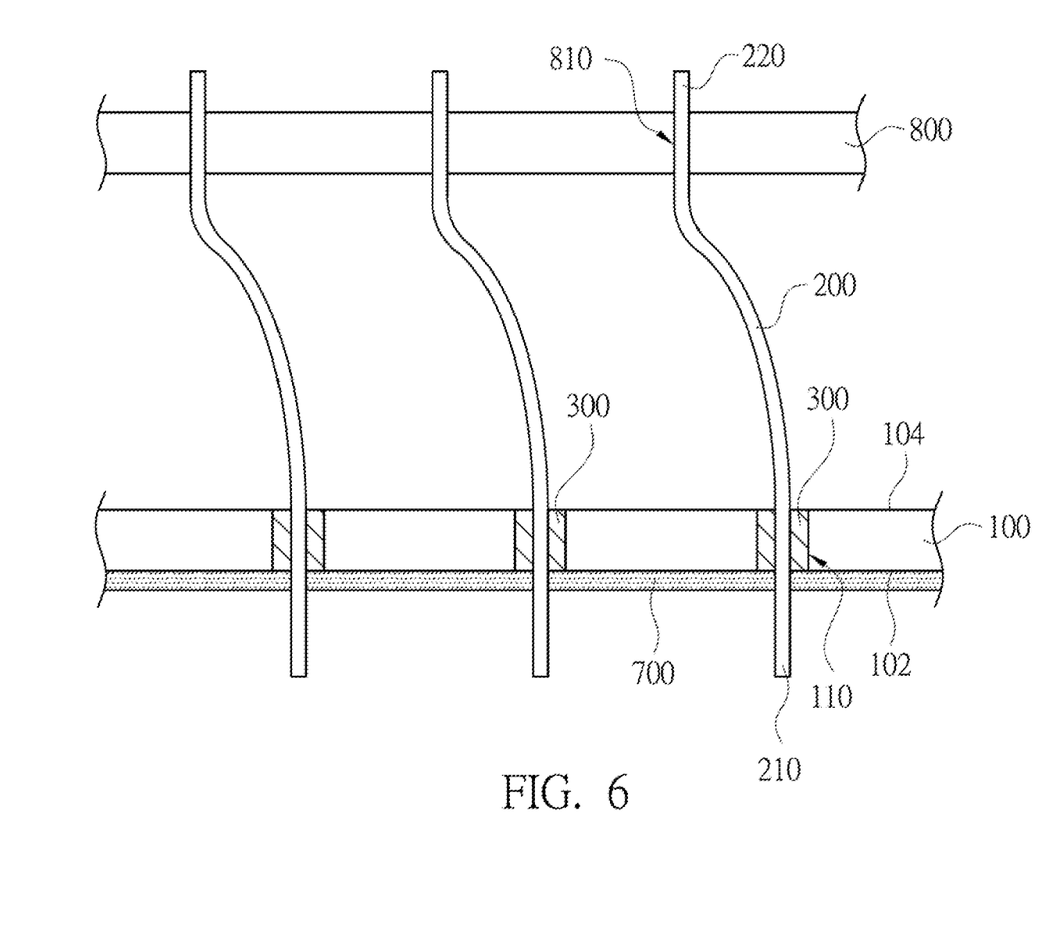
FIG. 6 is a cross-sectional view of the probe head according to yet another embodiment of the present invention.
Figure 7:
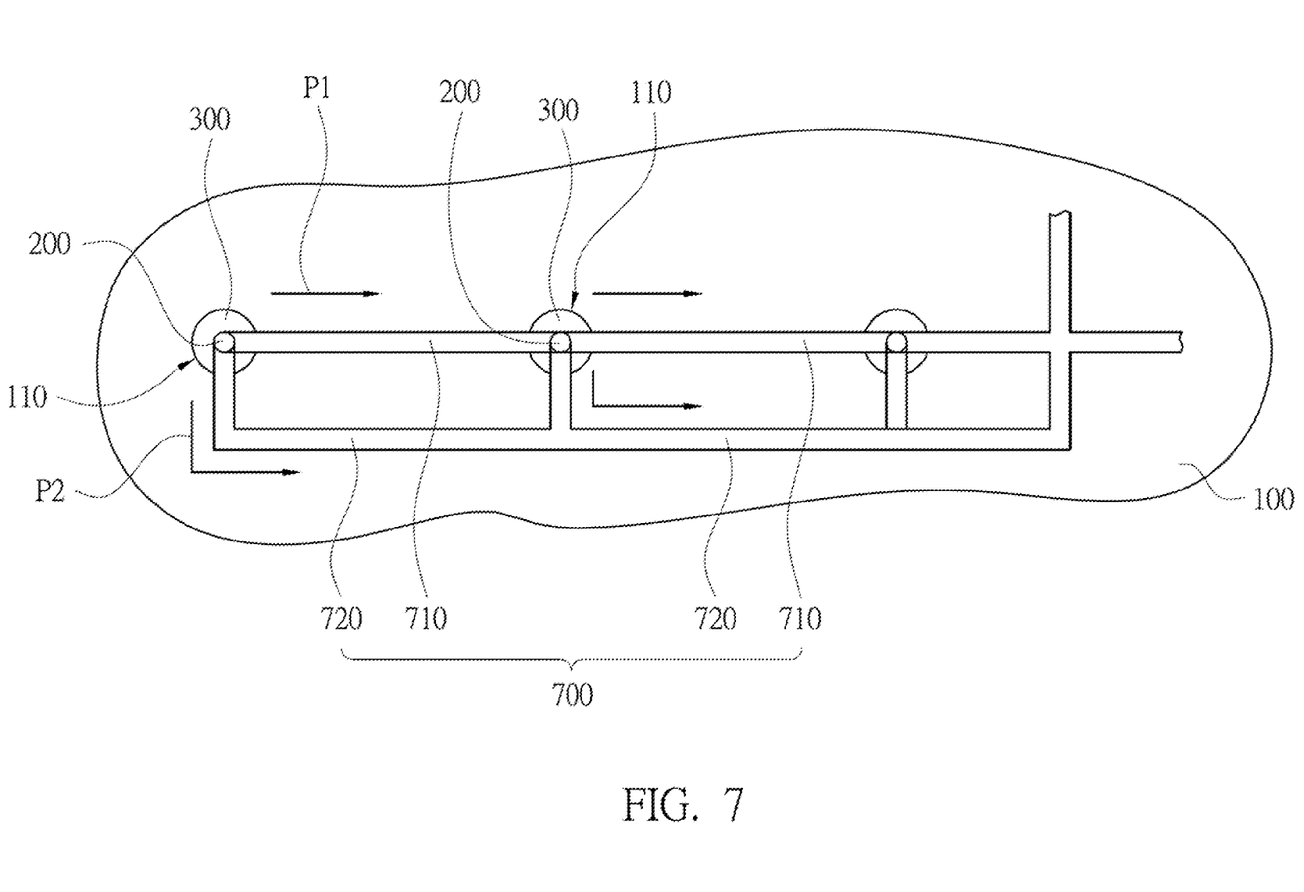
FIG. 7 is a bottom view of the probe head of FIG. 6.

FIG. 6 is a cross-sectional view of the probe head according to yet another embodiment of the present invention, and FIG. 7 is a bottom view of the probe head of FIG. 6. Reference is made to FIGS. 6 and 7. The difference between the present embodiment and the embodiment of FIGS. 1A and 1B relates to additional element of a bypass wire 700. In this embodiment, the plate 100 has opposite major surfaces 102 and 104, and the through hole 110 is through the major surfaces 102 and 104. The bypass wire 700 is disposed on at least one of the major surfaces 102 and 104, i.e., the major surface 102 in this embodiment, and electrically connected to at least two of the composite coating layers 300. The bypass wire 700 can touch the probe 200 through the composite coating layer 300 when the probe is inserted to the through hole 110. As such, the current passes through the probe 200 can be spread out through the bypass wire 700 to prevent the probe 200 from burning when the probe 200 touches the testing point of the device.

In greater detail, in this embodiment, the bypass wire 700 is disposed on the major surface 102 of the plate 100, and the bypass wire 700 includes at least one major portion 710 electrically connected to at least two of the composite coating layers 300 in series. The major portion 710 is configured for being connected to the composite coating layers 300 to form a major bypass path P1. The bypass wire 700 may be formed using printed wiring layout method or other proper methods.

In other embodiments, the bypass wire 700 can further include at least one minor portion 720 electrically connected to the major portion 710 in parallel, and the minor portion 720 is longer than the major portion 710. Taking FIG. 6 as an example, the major portion 710 can be a straight-line shape, and the minor portion 720 can be substantially u-shaped. However, the claimed scope of the present invention is not limited in this respect. The two adjacent minor portions 720 can be arranged side by side, and the two minor portions 720 are respectively connected to two composite coating layers 300 next to each other, such that the minor portions 720 form a minor bypass path P2.

When a plurality of the probes 200 are being assembled to the plate 100, each of the probes 200 respectively thread through the through holes 110 of the plate 100 to be respectively electrically connected to the composite coating layers 300. As such, when the probes 200 touch the testing points of the device, the probes 200 can smoothly slide in the through holes 110 due to the coefficient of friction of the composite coating layer 300. In addition, the probe 200 can still be electrically connected to the composite coating layer 300 even if the probe 200 is sliding. Moreover, when the probe 200 touches the testing point of the device, the current passes through the probe 200 can flow to the bypass wire 700 through the composite coating layer 300, and then spread out from the major bypass path P1 formed by the major portion 710 of the bypass wire 700 and the minor bypass path P2 formed by the minor portion 720 of the bypass wire 700. Therefore, the bypass wire 700 can prevent the probe 200 from burning even if a high power current passes through the probe 200, and the size of the probe 200 can be reduced to improve the testing results according to real requirements.

In this embodiment, the key features of the minor portion 720 are assisting the main portion 710 to share the current, and are provided as spares. That is, if the main portion 710 is broken due to the manufacturing defect or long-term use, the probes 200 can be connected through the minor portions 720. However, the minor portion 720 can be omitted in the bypass wire 700. The bypass wire 700 including the minor portion 720 can share the current, i.e., the probe 200 can bear higher power current.

The embodiments mentioned above can be applied as transmit paths of power probes. The power probe is a path that transmits power to the device when the probe head touches the device. According to the description mentioned above, the power of the device is increased. However, the radius of the power probe may be reduced to match the size of the device. Therefore, the embodiment of the present invention provides a bypass path to share the power of the testing device transmitting to the probe 200, i.e., the power probe, through the bypass wire 700, and the burning of the power probe can be improved.

Reference is made to FIG. 0. In one or more embodiments, the probe head may further include a supporting board 800 disposed opposite the plate 100. The supporting board 800 has at least one via hole 810 therein, and at least another portion of the probe 200 is disposed in the via hole 810 of the supporting board 800. The probe 200 has a contact end 210 for being in electrical contact with a device to be tested, and the contact end 210 is closer to the plate 100 than to the supporting board 800. In other words, the probe 200 has a top end 220 opposite to the contact end 210, and the top end 220 is closer to the supporting board 800 than to the plate 100. In this embodiment, the supporting board 800 may provides alignment, guiding, and supporting of the probe head. It should be noted that although the plate 100 includes bypass wire 700 in FIG. 6, the claimed scope of the present invention is not limited in this respect. In other embodiments, the bypass wire 700 of the plate 100 can be omitted according to real requirements.

It should be noted that the probe head mentioned above can be used in the vertical probe card (VPC), and the probe 200 mentioned above can be a vertical buckling probe or a pogo pin. Since the vertical buckling probe has a body portion formed as buckling or curved shape which is not easy to be burned due to high inrush current, the probe head mentioned above can be applied to the vertical buckling probe to get a good property.

Figure 8:
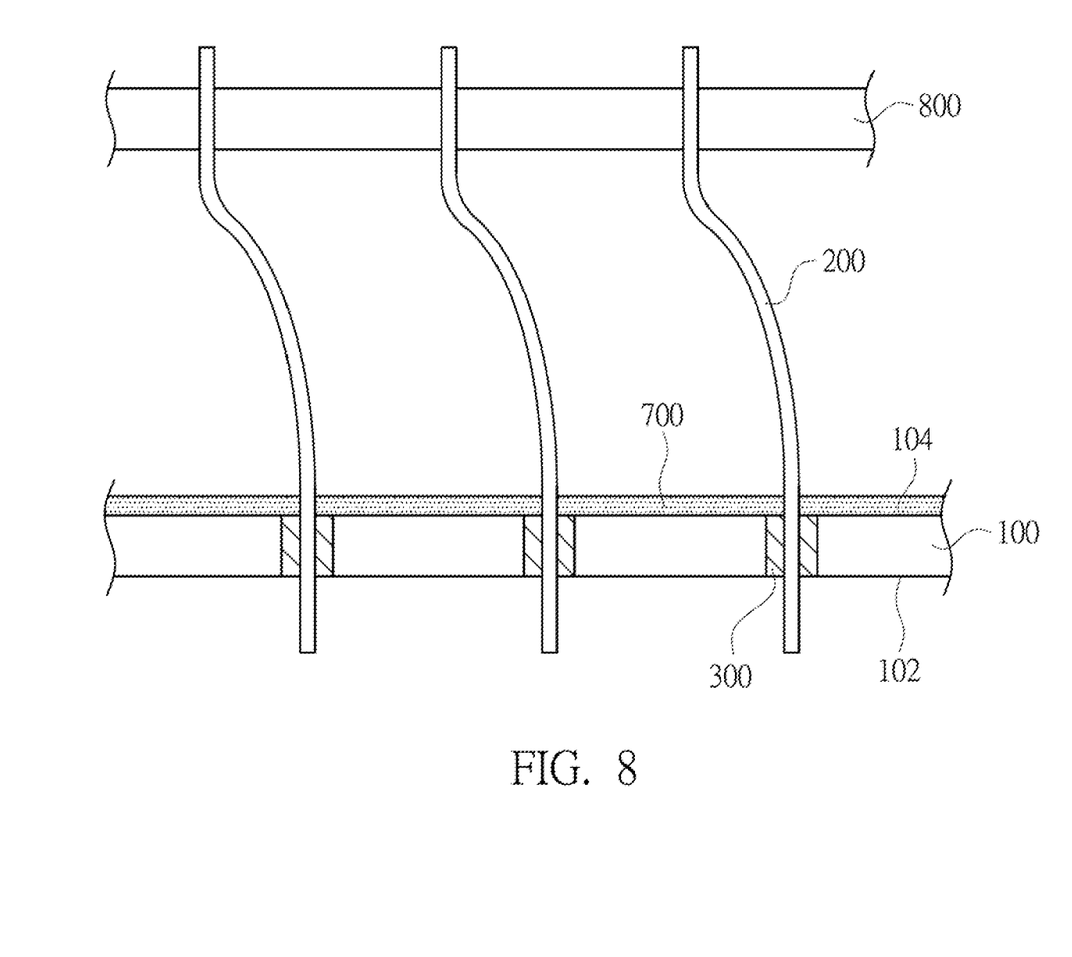
FIG. 8 is a cross-sectional view of the probe head according to yet another embodiment of the present invention.

It should be noted that although the bypass wire 700 is disposed on the major surface of the plate 100 distal to the supporting board 800, i.e., the major surface 102, the claimed scope of the present invention is not limited in this respect. Reference is made to FIG. 8 which is a cross-sectional view of the probe head according to yet another embodiment of the present invention. The difference between the present embodiment and the embodiment of FIG. 6 relates to the position of the bypass wire 700. In this embodiment, the bypass wire 700 is disposed on the major surface of the plate 100 proximal to the supporting board 800, i.e., the major surface 104. As such, the current passes through the probe 200 can be spread out through the bypass wire 700 to prevent the probe 200 from burning when the probe 200 touches the testing point of the device. Other relevant structural details of the present embodiment are all the same as the embodiment of FIG. 6, and, therefore, a description in this regard will not be repeated hereinafter.

Reference is made to FIG. 2. In summary, the embodiments of the present invention provide the probe head whose plate 100 includes the composite coating layer 300. The lubricating particles 320 can prevent the probe 200 from being stuck in the through hole 110 when the probe 200 slides in the through hole 110. The rigidity of the metal layer 310 can be selected to match the rigidity of the probe 200, such that the wearing between the probe 200 and the plate 100 can be improved even thought the probe 200 touches the metal layer 310 of the composite coating layer 300, and the life times of the probe 200 and the plate 100 can be both increased. The probe head can selectively include the base layer 400 and the seeds 500 to increase the adhesion between the composite coating layer 300 and the wall of the through hole 110. Moreover, the probe head can selectively include the bypass wire 700 (see FIG. 7) to reduce the probability of burning.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A probe head, comprising:
    a plate having at least one through hole therein;
    a probe at least partially disposed in the through hole of the plate; and
    at least one composite coating layer disposed on a sidewall of the through hole of the pate, wherein the composite coating layer comprises:
        a metal layer disposed in the through hole of the plate and between the plate and the probe; and
        a plurality of lubricating particles dispersed in the metal layer.

2. The probe head of claim 1, wherein the lubricating particles are made of Polytetrafluoroethene (PTFE).

3. The probe head of claim 1, wherein the metal layer has an outer surface facing the probe and an inner surface opposite the outer surface, and the lubricating particles at the outer surface of the metal layer are denser than the lubricating particles at the inner surface of the metal layer.

4. The probe head of claim 1, further comprising:
    at least one base layer disposed between the metal layer and the plate.

5. The probe head of claim 4, wherein the base layer and the metal layer are made of the same material.

6. The probe head of claim 4, wherein an interface is formed between the base layer and the metal layer.

7. The probe head of claim 4, further comprising:
    a plurality of seeds disposed between the base layer and the plate.

8. The probe head of claim 1, wherein the through hole is circle-shaped or square-shaped.

9. The probe head of claim 1 wherein the plate is made of ceramic.

10. The probe head of claim 1, wherein the plate is made of silicon.

11. The probe head of claim 10, further comprising:
an insulating layer disposed between the metal layer and the plate.

12. The probe head of claim 10, further comprising:
an insulating layer covering the entire surface of the plate.

13. The probe head of claim 1, wherein the plate has opposite major surfaces, and the through hole is through the major surfaces; and further comprising:
at least one bypass wire disposed on at least one of the major surfaces of the plate and electrically connected to the composite coating layer.

14. The probe head of claim 13, wherein the bypass wire is electrically connected to at least two of the composite coating layers.

15. The probe head of claim 13, wherein the bypass wire comprises at least one major portion electrically connected to at least two of the composite coating layers in series.

16. The probe head of claim 15, wherein the bypass wire further comprises at least one minor portion electrically connected to the major portion in parallel.

17. The probe head of claim 16, wherein the minor portion is longer than the major portion.

18. The probe head of claim 13, further comprising:
a supporting board disposed opposite the plate, wherein the supporting board has at least one via hole therein, at least another portion of the probe is disposed in the via hole of the supporting board, the probe has a contact end for being in electrical contact with a device to be tested, and the contact end is closer to the plate than to the supporting board.

19. The probe head of claim 18, wherein the bypass wire is disposed at least on the major surface of the plate distal to the supporting board.

20. The probe head of claim 18, wherein the bypass wire is disposed at least on the major surface of the plate proximal to the supporting board.

* * * * *